United States Patent [19]

Aoyagi et al.

[11] Patent Number: 4,604,583
[45] Date of Patent: Aug. 5, 1986

[54] FREQUENCY OFFSET CORRECTING CIRCUIT

[75] Inventors: Hidehito Aoyagi; Botaro Hirosaki, both of Tokyo, Japan

[73] Assignee: NEC Corporation, Tokyo, Japan

[21] Appl. No.: 643,792

[22] Filed: Aug. 24, 1984

[30] Foreign Application Priority Data

Aug. 26, 1983 [JP] Japan ................................ 58-156100

[51] Int. Cl.$^4$ .............................................. H03D 3/00
[52] U.S. Cl. .................................. 329/122; 329/126; 375/81; 375/120
[58] Field of Search ................. 329/50, 122, 124, 126; 375/81, 94, 120

[56] References Cited

U.S. PATENT DOCUMENTS 3,818,347 6/1974 Holsinger ....................... 375/120 X Primary Examiner—Eugene R. LaRoche
Assistant Examiner—James C. Lee
Attorney, Agent, or Firm—Schwartz, Jeffery, Schwaab, Mack, Blumenthal & Evans

[57] ABSTRACT

A second-order phase-locked loop (PLL) is provided following a demodulating section which is arranged to detect the baseband signals of incoming parallel channel signals. The second-order PLL, which is supplied with a baseband signal of a pilot channel from the demodulating section, includes a first and second control loops. The first control loop is adapted to correct a static phase shift of the pilot channel signal, while the second control loop functions to correct an abrupt frequency offset of same. The second-order PLL is further utilized to correct both static phase shifts and abrupt frequency offsets of data channels (viz., channels other than the pilot channel). A third control loop is further provided which extends between the second-order PLL and the input of the demodulating section, and which has a function by which static or slowly changing frequency offsets of the channels are compensated.

3 Claims, 7 Drawing Figures

FREQUENCY OFFSET CORRECTING CIRCUIT

BACKGROUND OF THE INVENTION

1. Field of The Invention

The present invention relates to a frequency offset correcting circuit, and more specifically to such a circuit for use in a demodulator which forms part of an orthogonally multiplexed parallel data transmission system. This invention features an effective correction or removal of a dynamic or abrupt frequency offset caused by Doppler effect (for example).

2. Description of the Prior Art

It is known in the art that an orthogonally multiplexed parallel data transmission system allows spectrum overlappings within a predetermined bandwidth, and hence attains a very high efficiency of data transmission up to approximately the efficiency of the ideal Nyquist transmission. Therefore, such a transmission system has found demand wherein very high efficiencies of digital transmission are important.

In such a transmission system, parallel data are transmitted through a plurality of channels by modulating two carrier components 90° apart in phase of each channel, while maintaining the orhogonality of adjacent channels. The relative relationship of carrier frequencies of all the channels can be kept constant during data transmission, but the carrier frequencies are liable to be shifted as a whole due to Doppler effect (for example). It is therefore necessary to especially correct this kind of abrupt frequency offset.

In order to correct the above-mentioned doppler shift, it is a current practice to provide a phase-locked loop (PLL) in a demodulator. More specifically, the phase-locked loop is arranged to correct the frequency offset using a pilot signal which is transmitted through a reference channel.

In accordance with a known demodulator having a doppler correction function, a second-order phase-locked loop is provided which includes a demodulating section. The demodulating section, however, includes a low-pass filter for channel separation or removal of interchannel interferences. This filter provides an incoming signal with a considerably large amount of delay time. Consequently, the loop gain should be lowered to ensure stable operation of the loop, and hence the known demodulator has encountered a problem that the phase-locked loop included therein is unable to follow abrupt frequency offsets caused by Doppler effect.

SUMMARY OF THE INVENTION

It is therefore an object of the present invention to provide a frequency offset correcting circuit free from the aforementioned problem inherent in the prior art.

Another object of the present invention is to provide a circuit which is capable of following abrupt frequency offsets caused by Doppler effect and hence is able to effectively correct same.

Still another object of the present invention is to provide a circuit which is able to correct an abrupt frequency offset, static phase shift, and slowly changing frequency offset.

These objects are fulfilled by a second-order phase-locked loop (PLL) which is provided following a demodulating section arranged to detect the baseband signals of orthogonally multiplexed QAM signals. The second-order PLL, which is supplied with a baseband signal of a pilot channel from the demodulating section, includes a first and second control loops. The first control loop is adapted to correct a static phase shift of the pilot channel signal, while the second control loop functions to correct an abrupt frequency offset of same. The second-order PLL is further utilized to correct both static phase shifts and abrupt frequency offsets of data channels (viz., channels other than the pilot channel). A third control loop is further provided which extends between the second-order PLL and the input of the demodulating section, and which has a function by which static or slowly changing frequency offsets of the channels are compensated.

More specifically, the present invention takes the form of a frequency offset correction circuit for use in a demodulator which forms part of an orthogonally multiplexed QAM system, the demodulator including a demodulating section which receives the orthogonally multiplexed QAM signals to recover each baseband signal of parallel channels, the frequency offset correction circuit comprising: a second-order phase-locked loop which includes a first and second control loops and which is coupled to the output of the demodulating section, the second-order phase-locked loop being supplied with a baseband signal of a pilot channel of the parallel channels to compensate for a static phase shift and an abrupt frequency offset using the first and second control loops respectively; a phase compensator which is coupled to the demodulating section so as to receive the baseband signals of data channels of the parallel channels, the phase compensator being controlled by the second-order phase-locked loop in order to correct the phase shifts and the frequency offsets of the data channels; and a third control loop which is coupled between the second-order phase-locked loop and the input of the demodulating section, the third control loop being arranged to correct a static or slow-changing frequency offset.

BRIEF DESCRIPTION OF THE DRAWINGS

The features and advantages of the present invention will become more clearly appreciated from the following description taken in conjunction with the accompanying drawings in which like blocks, circuits or circuit elements are denoted by like reference numerals and in which.

DETAILED DESCRIPTION OF THE PREFERRED EMBODIMENTS

Before going into the details of the present invention, a prior art will be discussed with reference to FIGS. 1 and 2.

Figure 1:
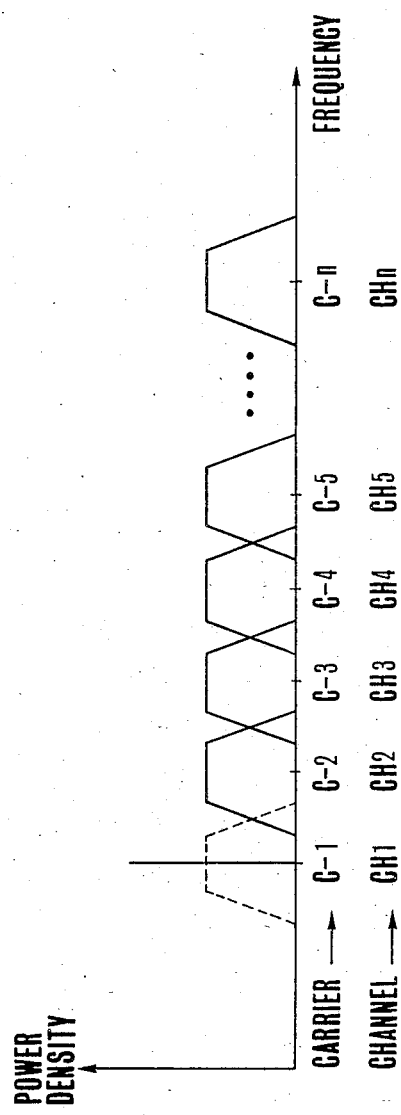
FIG. 1 is a diagram showing the spectrum of channels for use in an orthogonally multiplexed QAM transmission system.

FIG. 1 shows the spectrum of n-channel (CH1 through CHn) for transmitting orthogonally multiplexed Quadrature Amplitude Modualation (O-QAM) signals, wherein the first channel is utilized as a reference channel in this instance. FIG. 2 is a block diagram showing a known digital modulator together with preceding sections.

As shown in FIG. 1, "n" channels are provided which includes the corresponding carriers (C-1 through C-n) respectively. The frequencies of the carriers are uniformly separated by 200 Hz (for example). The in-phase and quadrature components of each carrier are independently modulated, while the orthogonality between the adjacent channels is maintained. As previously mentioned, one of the channels is utilized as a reference or pilot channel (the first channel in this instance), wherein (a) one of the two components (in-phase or quadrature) of the carrier is unmodulated and (b) the other component data is not transmitted. The first channel shown in FIG. 1 has therefore no spectrum. It goes without saying that if another channel is utilized as the reference channel, the first channel has a spectrum shown by a broken line just like the other channels (viz., data channels). It is assumed in this specification that (a) the in-phase component of the pilot channel (CH1) is unmodulated and (b) the quadrature component data thereof is not transmitted.

Figure 2:
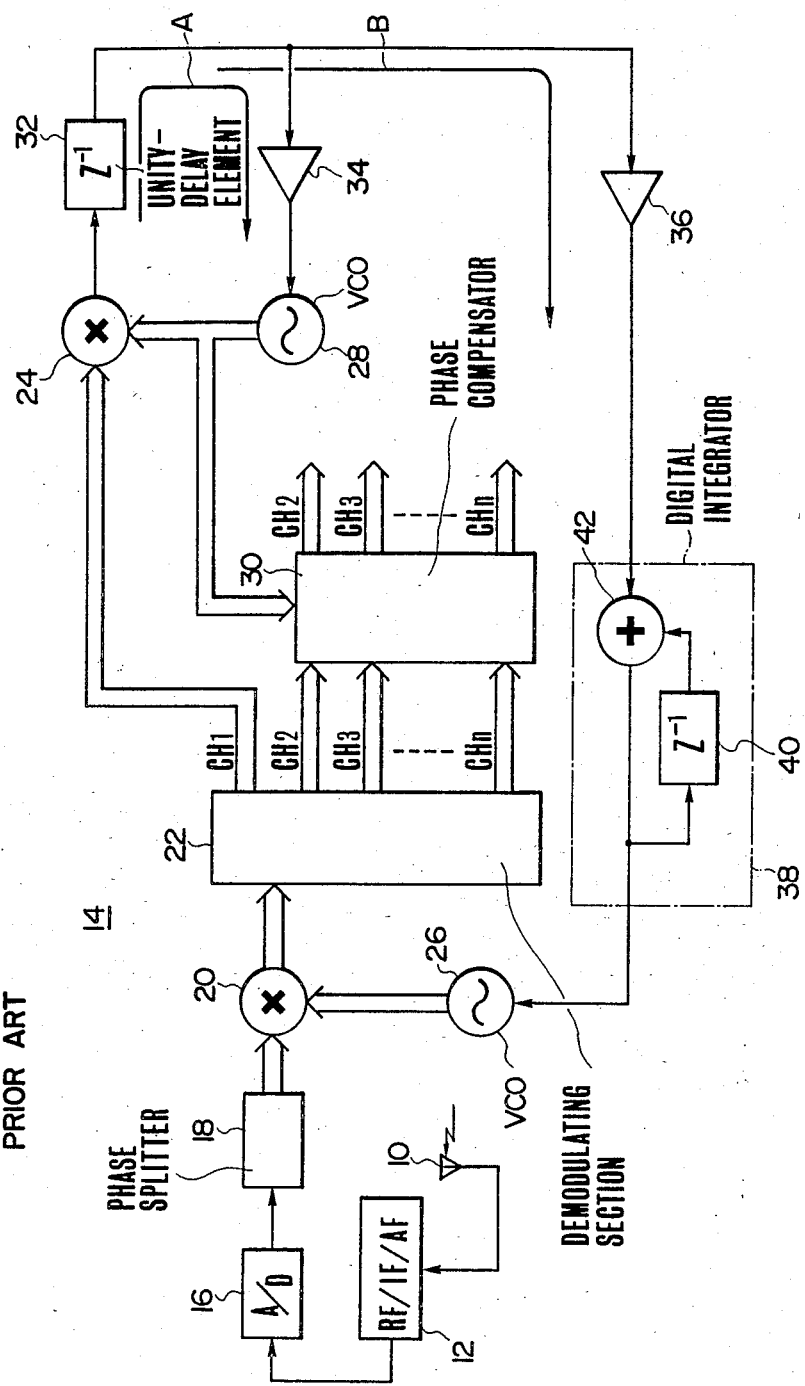
FIG. 2 is a block diagram showing a known digital demodulator together with sections preceding the demodulator.

As shown in FIG. 2, a signal emitted from a transmitter (not shown) is applied via an antenna 10 to a RF/IF/AF (wherein RF, IF and AF denote radio, intermediate and audio frequencies, respectively) section 12, which will be not described in detail since it is not directly pertinent to the present invention. The RF/IF/AF section 12 applies the output thereof to a digital demodulator denoted by reference numeral 14. The output of the RF/IF/AF section 12 is an orthogonally multiplexed QAM signal with an audio frequency.

The demodulator 14 is provided with the functions by which frequency and phase offsets are compensated. The demodulator 14 receives the orthogonally multiplexed QAM signals and recovers the baseband signals therefrom.

As shown, the demodulator 14 comprises an A/D (analog-to-digital) converter 16, a phase splitter 18, two multipliers (or phase rotators) 20 and 24, a demodulating section 22, two digital VCOs (voltage-controlled oscillators) 26 and 28, a phase compensator 30, a unity-delay element 32, two loop amplifiers 34 and 36, and a digital integrator 38 which includes another unity-delay element 40 and an adder 42, all of which are coupled as shown. The term "unity-delay element" is defined in this specification as an element which provides an input signal with a delay time equal to one sampling time interval.

First and second control loops A and B, which in combination take the form of a second-order phase-locked loop, are provided for compenstating a phase shift and a frequency offset by controlling the VCOs 28 and 26 respectively.

In order to avoid a redundancy, a problem inherent in the prior art will be discussed only with reference to the control loops A and B, in that the details of the major blocks shown in FIG. 2 will be described later with reference to FIGS. 4 through 7.

The first loop A is to compensate the phase shift which is maintained substantially constant or varies slowly, and is comprised of the phase rotator 24, the unity-delay element 32, the amplifier 34 for providing the loop gain, and VCO 28. On the other hand, the second frequency control loop B is provided for compensating a frequency offset, and is comprised of the phase rotator 24, the unity-delay element 32, the amplifier 36 for providing the loop gain, the digital integrator 38, VCO 26, the phase rotator 20, and the demodulating section 22. This second loop B, however, includes the demodulating section 22 which includes a low-pass filter (not shown) for channel separation. This low-pass filter provides the incoming data with a considerable delay time, and hence the gain of the loop amplifier 36 should be set to a low value to ensure stable loop operation. Consequently, the prior art has encountered a difficulty that the low gain of the loop amplifier 36 prevents the control loop B from following the abrupt frequency offset.

The present invention is therefore directed to eliminate the above-mentioned prior art difficulty.

Figure 3:
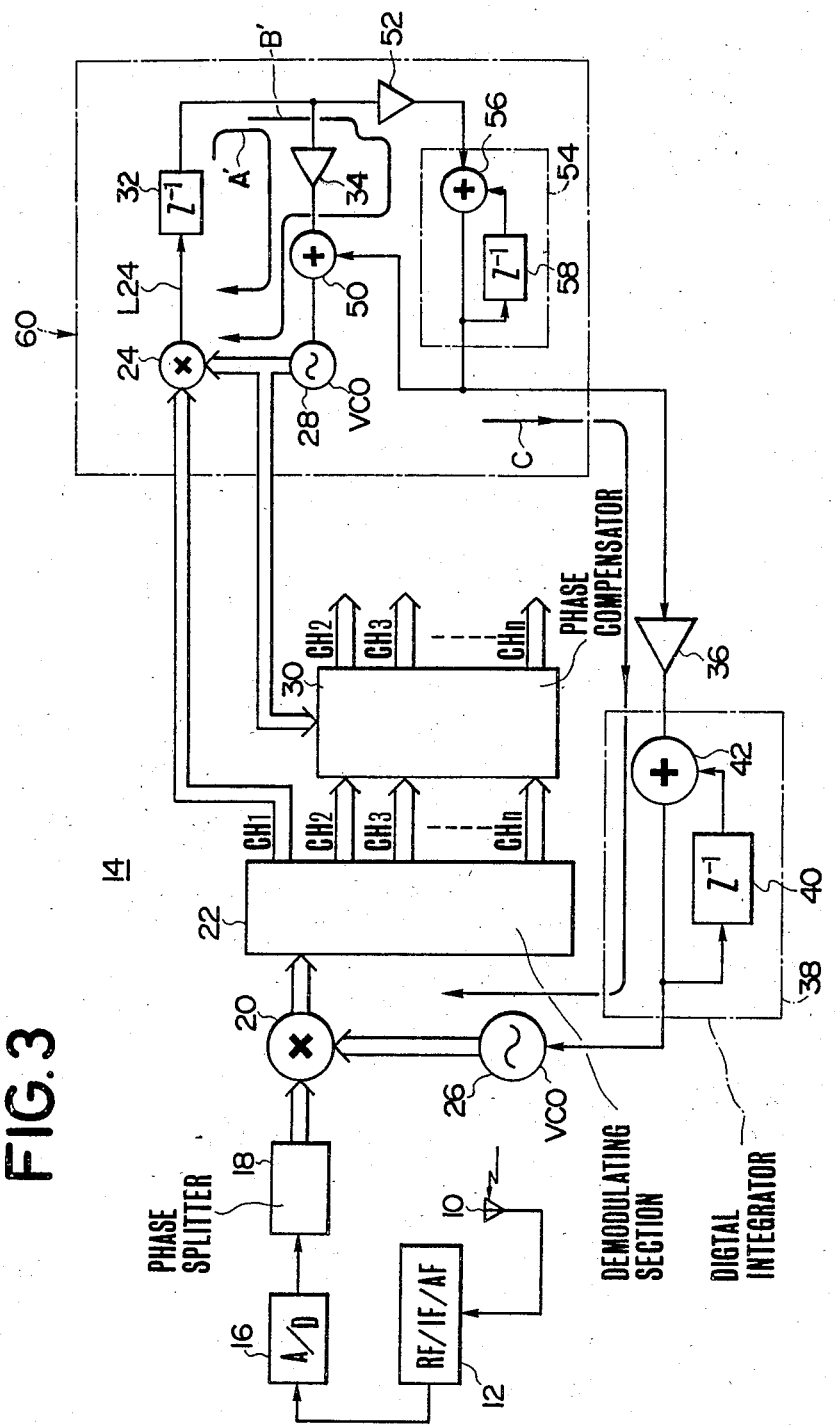
FIG. 3 is a block diagram showing a digital demodulator, together with sections preceding the demodulator, to which the present invention is applicable.

FIG. 3 is a block diagram showing a digital demodulator according to the present invention, wherein the blocks of the same nature as those shown in FIG. 2 are denoted by like reference numerals. Each of FIGS. 4 through 7 is a block diagram showing the detailed circuit configuration of a corresponding block shown in FIG. 3.

Comparing the circuit arrangement of FIG. 3 with that of FIG. 2 shows that the former arrangement further includes an adder 50, a loop amplifier 52, and an integrator 54 which includes an adder 56 and a unity-delay element 58. These blocks constitute a second-order phase-locked loop (or digital PLL) 60 in combination with the aforementioned blocks 24, 28, 32 and 34.

In FIG. 3, the RF/IF/AF section 12 applies the output thereof to the A/D converter 16, which samples the incoming data with a predetermined sampling frequency and applies the digital data sequences to the phase splitter 18. This phase splitter 18 is arranged to convert the digital data sequences applied into a real and imaginary part data sequences, wherein the imaginary part data is advanced by 90° in phase relative to the real part data. One example of the phase splitter 18 is shown in block diagram form in FIG. 4.

Figure 4:
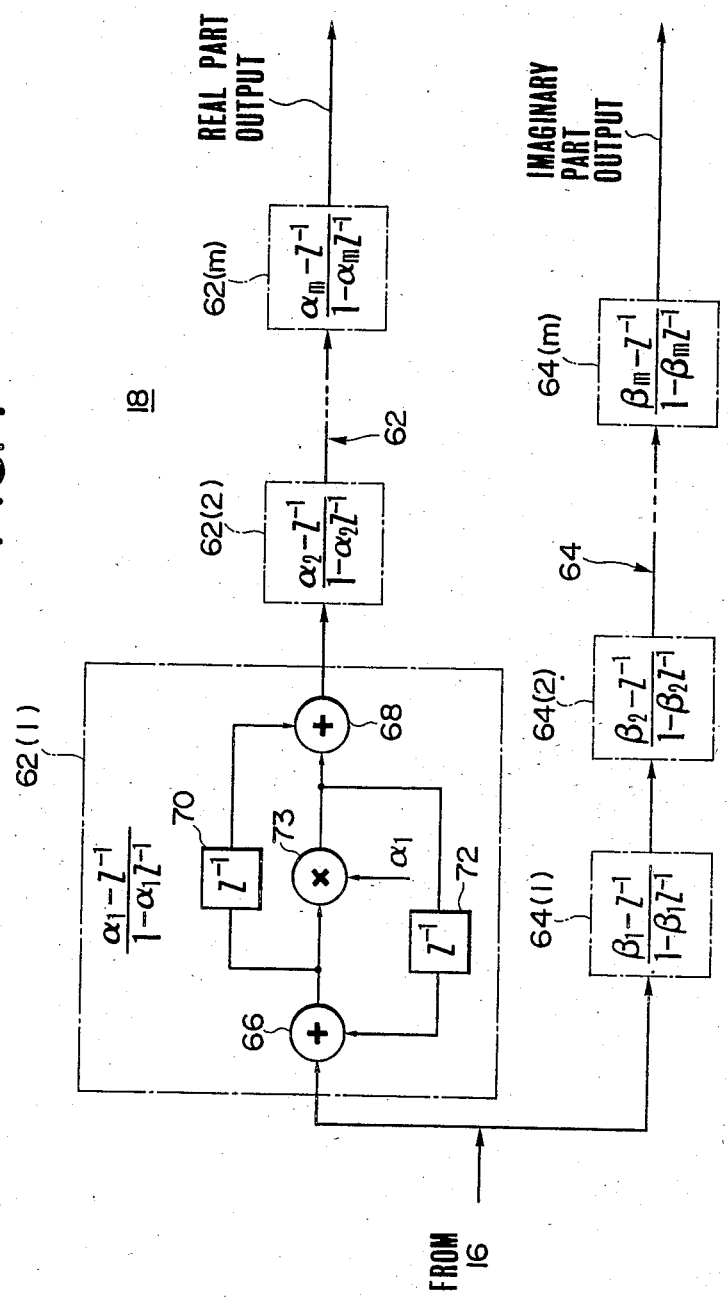
FIG. 4 is a block diagram showing one example of a conventional phase splitter of the FIG. 3 arrangement.

The phase splitter 18 shown in FIG. 4 takes the form of an all-pass network including two delay lines 62 and 64. The delay lines 62 and 64 are provided with delay units 62(1)–62(m) and 64(1)–64(m), respectively. The delay unit 62(1) includes two adders 66 and 68, two unity-delay elements 70 and 72 and a multiplier 73. This multiplier 73 is controlled in accordance with transfer function coefficient $\alpha_1$. The delay unit 62(1) provides an incoming signal with a time delay of:

$$(\alpha_1 - Z^{-1})/(1 - \alpha_1 Z^{-1})$$

wherein $Z^{-1}$ denotes a delay time provided by each of the unity-delay element 70 and 72. Each of the other delay units arranged in the lines 62 and 64 is of the same circuit configuration as the delay unit 62(1) (wherein each of $\alpha_2$ through $\alpha_m$ and $\beta_1$ through $\beta_m$ denotes a transfer function coefficient), so that further description thereof will be omitted.

The phase splitter 18 supplies the complex data sequences to the phase rotator (viz., multiplier) 20 which is arranged to further receive the complex data from the VCO 26.

Figure 5:
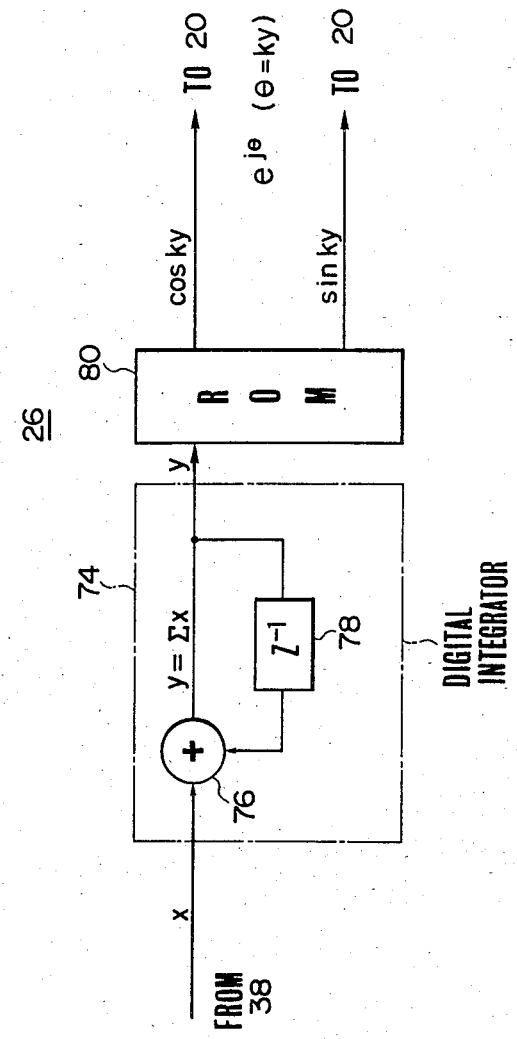
FIG. 5 is a block diagram showing one example of a conventional voltage-controlled oscillator of the FIG. 3 arrangement.

FIG. 5 is a block diagram showing one example of the VCO 26, which comprises a digital integrator 74 (consisting of an adder 76 and a unity-delay element 78) and a read only memory (ROM) 80. The VCO 26 produces complex data sequences each of which rotates in phase with the frequency proportional to the signal level applied thereto. As shown in FIG. 5, the integrator 5 is supplied with a voltage signal "x" from another integrator 38 (FIG. 3) and integrates (viz., successively adds) the applied signals. The ROM 80, which includes a look-up table, receives the output "y" of the integrator 74 and produces two data: sin ky and cos ky (wherein k is a proportional constant). The VCO 26 produces complex data sequences, each phase angle of which can rotate clockwise or counterclockwise and also can remain zero.

The phase rotator 20 (FIG. 3) is supplied with two complex data from the phase splitter 18 and the VCO 26, and multiplies this two data in order that the complex data from the phase splitter 18 is rotated clockwise or counterclockwise in phase by the instantaneous phase angle of the complex data applied from the VCO 26. In other words, in the case where the complex data from the phase splitter 18 is rotated clockwise, the data output of the phase splitter 18 is frequency shifted upward by the oscillating frequency of the VCO 26. Conversely, in the case where the complex data from the phase splitter 18 is rotated counterclockwise, the data output of the phase splitter 18 is frequency shifted downward by the oscillating frequency of the VCO 26.

More specifically, the phase rotator 20 multiplies the complex data from the phase splitter 18 by the complex conjugate data from the VCO 26. Assuming that (a) the complex data $\dot{S}$ from the phase splitter 18 is represented by $\dot{S} = Sr + jSi$ and (b) the complex data $\dot{L}$ from the VCO 26 by $\dot{L} = Lr + jLi$, then the phase rotator 20 performs the following multiplication:

$$\dot{S}\dot{L} = (Sr + jSi)(Lr - jLi)$$
$$= SrLr + SiLi + j(-SrLi + SiLr)$$

Figure 6:
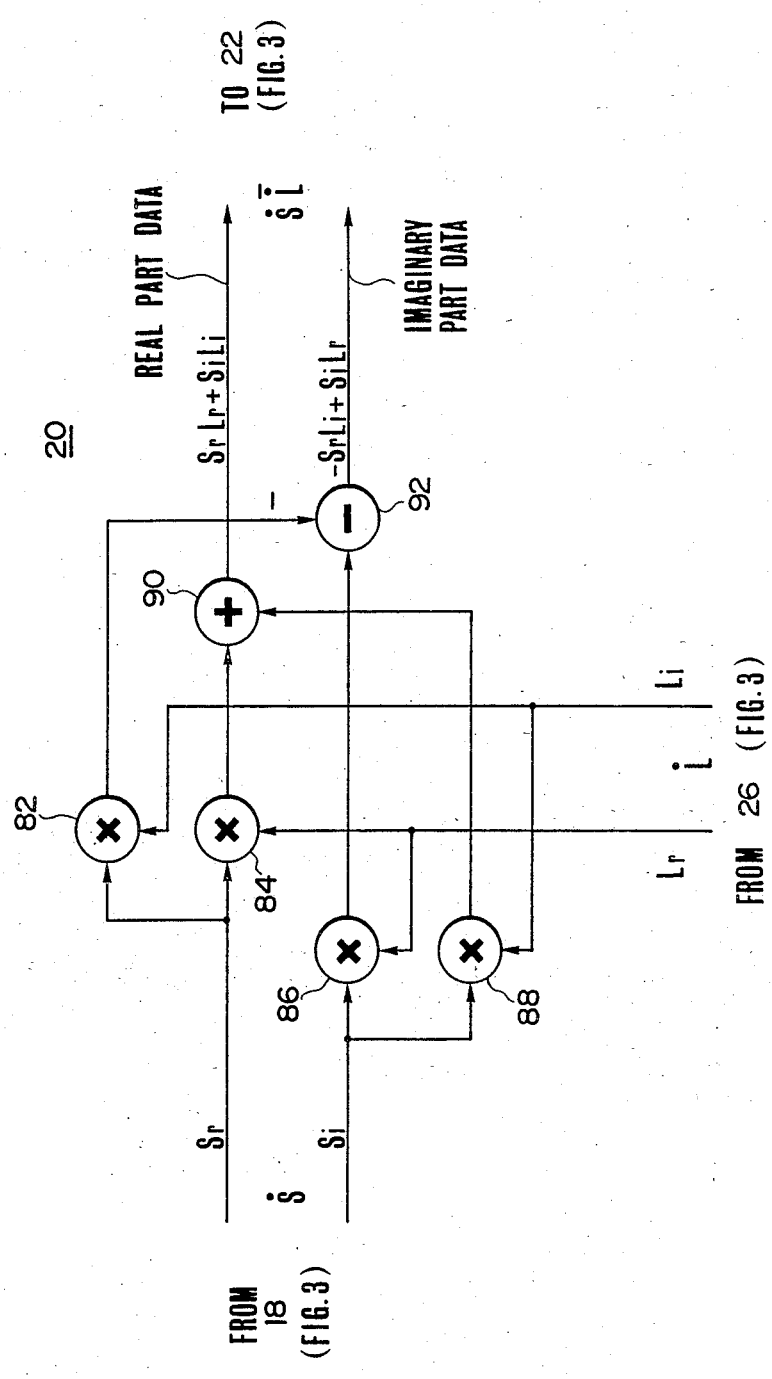
FIG. 6 is a block diagram showing one example of a known phase rotator (or multiplier) of the FIG. 3 arrangement.

FIG. 6 shows in block diagram form the phase rotator 20, which comprises four multipliers 82, 84, 86 and 88, an adder 90 and a subtracter 92. The operation of the FIG. 6 arrangement is understandable by those skilled in the art, and hence the details thereof will be omitted for clarity. The results of the above multiplication are applied to the next stage, viz., the demodulating section 22 (FIG. 3).

The demodulating section 22 includes, although not shown, digital oscillators, phase rotators and considerably narrow bandwidth low-pass filters, which are respectively assigned to corresponding channels. The section 22 recovers, using the digital oscillator and the phase rotator, the baseband signals (in-phase and quadrature components) of each channel, which are then applied to the low-pass filter to remove interchannel interferences or to ensure the channel separation. The baseband signals of the first channel CH1 are applied to the digital PLL 60, while those of the other channels CH2—CHn are applied to the phase compensator 30.

Figure 7:
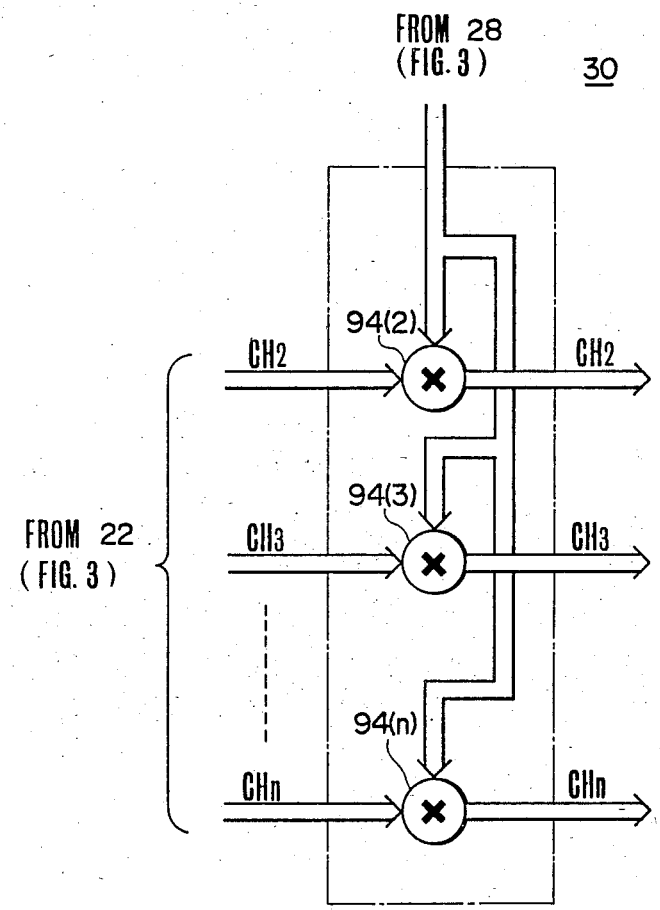
FIG. 7 is a block diagram showing one example of a known phase compensator of the FIG. 3 arrangement.

FIG. 7 shows in block diagram form one circuit configuration of the phase compensator 30, which includes a plurality of phase rotators 94(2) through 94(n) allotted to the channels CH2—CHn, respectively. Each phase rotator of FIG. 7 is adapted to compensate for a phase shift of the baseband signal of the corresponding channel through the use of the output of the VCO 28.

Turning now to FIG. 3, the demodulated complex data of the reference (or pilot) channel CH1 is applied to the phase rotator 24, the circuit arrangement of which is substantially the same as that of the phase rotator 20. As assumed previously, the pilot channel CH 1 is transmitted such that (a) the in-phase component data thereof is unmodulated and (b) the quadrature component (viz., imaginary part) data thereof is not transmitted. Consequently, in this instance, the phase rotator 24 is arranged to produce only the imaginary part data as a reference or control data which is utilized to compensate for the frequency offset and the phase shift. This is the reason why the phase rotator 24 is coupled, via a single line L24, to the unity-delay element 32.

The digital PLL (viz., a second-order PLL) 60 inlcudes a first and second control loops A' and B'. The first control loop A' is adapted to rapidly compensate a static phase shift, while the second control loop B' is arranged to rapidly compensate a time-dependent phase shift which is caused by the abrupt frequency offset. The first control loop A' has substantially the same function as the aforementioned loop A (FIG. 2).

As shown, the control loop A' includes the phase rotator 24, the unity-delay element 32, the loop amplifier 34, the adder 50 and the VCO 28. On the other hand, the second control loop B' comprises the phase rotator 24, the unity-delay element 32, the loop amplifier 52, the digital integrator 54, the adder 50 and the VCO 28.

If there exist no frequency offset and no phase shift, each output of the VCO 28 and the phase rotator 24 remains zero in phase. Whilst, in case the output of the phase rotator 24 deviates from zero in phase due to the dynamic frequency offset or static phase shift, this output, which is applied to the amplifiers 34 and 52 by way of the unity-delay element 32, is utilized to correct the above-mentioned undesired phenomena. The amplifier 34 applies the output thereof to the VCO 28 via the adder 50, thereby to compensate for the static phase shift by controlling the oscillating frequency of the VCO 28.

With reference to the second control loop B', the integrator 54 is supplied with the output of the amplifier 52, and integrates or successively adds the outputs applied thereto. The output of the integrator 54 is fed via the adder 50 to the VCO 28. Assuming that the carrier of the pilot channel is frequency shifted by $f_e$, then the input applied to the phase rotator 24 rotates in phase counterclockwise with the shifted frequency $f_e$. In this instance, the integrator 54 successively adds the outputs of the amplifier 52 up to the value which corresponds to the shifted frequency $f_e$, thereby to compensate for the frequency deviation by controlling the VCO 28.

As shown, the digital PLL 60 includes no low-pass filter which provides an input signal with a considerable delay time, and hence each gain of the amplifiers 34 and 52 can be set to a high value. This means that in case the abrupt phase shifts occurs, the above-mentioned correcting operations can rapidly be implemented. The output of the VCO 28 is also applied to the phase compensator 30 which compensates for the static and dynamic (or time-varying) phase shifts of the other channels CH2 through CHn.

The output of the integrator 54 is also applied to another integrator 38 via the amplifier 36, which form part of a third control loop C. This loop C includes the aforementioned low-pass filter provided in the demodulating section 22, and hence is unable to follow the abrupt frequency offset, as described previously. The control loop C is therefore adapted to compensate for a frequency offset which continues or varies slowly for a relatively large amount of time after an abrupt occurrence. In brief, the abrupt frequency offset is corrected by the aforesaid PLL 60, while the static frequency offset is compensated for through the use of the third control loop C. More specifically, after the completion of the abrupt frequency offset correction, if this offset still continues, then the output of the integrator 54 is gradually applied to the integrator 38 through the low gain amplifier 36. The output of the integrator 38 is fed to the VCO 26 which serves to steer the frequency offset toward zero. The slightly compensated output of the phase rotator 20 is then applied to another phase rotator 24 via the demodulator section 22, resulting in the fact that the output levels of the integrators 54 and 38 are lowered and raised, respectively. These operations are repeated until the output of the integrator 54 becomes zero, in the case of which the output of the integrartor 38 is equal to the initial output level of the integrator 54. Thus, the static or slowly varing frequency offset can be corrected in front of the demodulating section 22.

The above-mentioned system can be modified such that the pilot signal is transmitted through two channels (for example, the lowest and highest channels). In this case, additional digital PLL (viz., second-order PLL) similar to the block 60 should be provided. Each of these two digital PLLs is adapted to function in the same manner as discussed previously. The average output of the two PLLs is applied to the control loop C (FIG. 3) in order to control the static or slowly changing frequency offset, which control has already been described.

The foregoing description shows only preferred embodiments of the present invention. Various modifications are apparent to those skilled in the art without departing from the scope of the present invention which is only limited by the appended claims.

What is claimed is:

1. A frequency offset correction circuit for use in a demodulator, said demodulator including a demodulating section which receives incoming parallel channel signals to recover each baseband signal of the parallel channels, said frequency offset correction circuit comprising:

a second-order phase-locked loop which includes a first and second control loop and which is coupled to the output of said demodulating section, said second-order phase-locked loop being supplied with a baseband signal of a pilot channel of said parallel channels to compensate for a static phase shift and an abrupt frequency offset using said first and second control loops respectively;

a phase compensator which is coupled to said demodulating section so as to receive the baseband signals of data channels of said parallel channels, said phase compensator being controlled by said second-order phase-locked loop in order to correct the phase shifts and the frequency offsets of said data channels; and a third control loop which is coupled between said second-order phase-locked loop and the input of said demodulating section, said third control loop being arranged to correct a static or slow-changing frequency offset.

2. A frequency offset correcting circuit as claimed in claim 1, wherein said first control loop includes a first phase rotator coupled to the output of said demodulating section, a unity-delay element coupled to receive the output of said first phase rotator, a first amplifier coupled to receive the output of said unity-delay element, an adder having one input coupled to the output of said first amplifier, and a first voltage-controlled oscillator which receives the output of said adder and which is coupled to said first phase rotator, and wherein said second control loop includes said first phase rotator, said unity-delay element, a second amplifier coupled to receive the output of said unity-delay element, a first integrator coupled to said second amplifier, and said first voltage-controlled oscillator, said adder having another input thereof coupled to the output of said first integrator.

3. A frequency offset correcting circuit as claimed in claim 2, wherein said third control loop includes a third amplifier for amplifying the output of said first integrator, a second integrator coupled to the output of said third amplifier, a second voltage-controlled oscillator which is controlled by the output of said second integrator, and a second phase rotator which is controlled by the output of said second voltage-controlled oscillator and which is supplied with said incoming parallel channel signals and which is coupled to the input of said demodulating section.

* * * * *